US009816179B2

(12) United States Patent
Milicevic et al.

(10) Patent No.: US 9,816,179 B2
(45) Date of Patent: *Nov. 14, 2017

(54) PLASMA DEPOSITION PROCESS WITH REMOVAL OF SUBSTRATE TUBE

(71) Applicant: Draka Comteq B.V., Amsterdam (NL)

(72) Inventors: Igor Milicevic, Helmond (NL); Johannes Antoon Hartsuiker, Eindhoven (NL); Mattheus Jacobus Nicolaas van Stralen, Tilburg (NL); Gertjan Krabshuis, Sint-Oedenrode (NL)

(73) Assignee: Draka Comteq, B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/985,961

(22) Filed: Dec. 31, 2015

(65) Prior Publication Data

US 2016/0186316 A1 Jun. 30, 2016

Related U.S. Application Data

(63) Continuation-in-part of application No. PCT/NL2014/050357, filed on Jun. 5, 2014.

(30) Foreign Application Priority Data

Jul. 1, 2013 (NL) ..................................... 2011075

(51) Int. Cl.
    C03B 37/018   (2006.01)
    C23C 16/01    (2006.01)
    C23C 16/40    (2006.01)

(52) U.S. Cl.
    CPC .......... *C23C 16/01* (2013.01); *C03B 37/0183* (2013.01); *C23C 16/402* (2013.01)

(58) Field of Classification Search
    CPC .................................................... C03B 37/018
    See application file for complete search history.

(56) References Cited

U.S. PATENT DOCUMENTS

| | | | |
|---|---|---|---|
| 4,314,833 A | 2/1982 | Kuppers | |
| 4,417,911 A | 11/1983 | Cundy et al. | |
| 4,838,643 A | 6/1989 | Hodges et al. | |
| 6,372,305 B2 | 4/2002 | Breuls et al. | |
| 6,988,380 B2 | 1/2006 | Neuberger et al. | |
| 7,356,234 B2 | 4/2008 | de Montmorillon et al. | |
| 7,483,613 B2 | 1/2009 | Bigot-Astruc et al. | |
| 7,526,177 B2 | 4/2009 | Matthijsse et al. | |
| 7,555,186 B2 | 6/2009 | Flammer et al. | |
| 7,587,111 B2 | 9/2009 | de Montmorillon et al. | |
| 7,623,747 B2 | 11/2009 | de Montmorillon et al. | |
| 7,716,952 B2 | 5/2010 | Schotz et al. | |
| 7,889,960 B2 | 2/2011 | de Montmorillon et al. | |
| 7,894,698 B2 | 2/2011 | Flammer et al. | |
| 7,899,293 B2 | 3/2011 | de Montmorillon et al. | |
| 7,995,888 B2 | 8/2011 | Gholami et al. | |
| 7,995,889 B2 | 8/2011 | de Montmorillon et al. | |
| 8,009,950 B2 | 8/2011 | Molin et al. | |
| 8,041,172 B2 | 10/2011 | Sillard et al. | |
| 8,055,111 B2 | 11/2011 | Sillard et al. | |
| 8,103,143 B2 | 1/2012 | de Montmorillon et al. | |
| 8,131,125 B2 | 3/2012 | de Montmorillon et al. | |
| 8,145,025 B2 | 3/2012 | de Montmorillon et al. | |
| 8,259,389 B2 | 9/2012 | Pastouret et al. | |
| 8,265,442 B2 | 9/2012 | Overton | |
| 8,274,647 B2 | 9/2012 | Gholami et al. | |
| 8,280,213 B2 | 10/2012 | Molin et al. | |
| 8,290,324 B2 | 10/2012 | Sillard et al. | |
| 8,301,000 B2 | 10/2012 | Sillard et al. | |
| 8,340,488 B2 | 12/2012 | Molin et al. | |
| 8,391,661 B2 | 3/2013 | Molin et al. | |
| 8,406,593 B2 | 3/2013 | Molin et al. | |
| 8,428,410 B2 | 4/2013 | Molin et al. | |
| 8,428,411 B2 | 4/2013 | de Montmorillon et al. | |
| 8,428,414 B2 | 4/2013 | de Montmorillon et al. | |
| 8,467,123 B2 | 6/2013 | Regnier et al. | |
| 8,483,535 B2 | 7/2013 | Molin et al. | |

(Continued)

FOREIGN PATENT DOCUMENTS

CN    1771205 A     5/2006
CN    102076623 A   5/2011

(Continued)

OTHER PUBLICATIONS

International Search Report in counterpart International Application No. PCT/NL2014/050357 dated Oct. 16, 2014, pp. 1-2.
International Preliminary Report on Patentability in counterpart International Application No. PCT/NL2014/050357 dated Jan. 5, 2016, pp. 1-5.
Office Action in counterpart Chinese Application No. 201480037856.4 dated Jul. 4, 2017, pp. 1-7 [U.S. Appl. No. 4,314,833 and US Publication Nos. 2009/0126408 and 2002/0002949 previously cited.].

(Continued)

*Primary Examiner* — Queenie Dehghan
(74) *Attorney, Agent, or Firm* — Additon, Higgins & Pendleton, P.A.

(57) ABSTRACT

Disclosed are methods for manufacturing a precursor for a primary preform for optical fibers via an internal plasma deposition process. An exemplary method includes creating a first plasma reaction zone having first reaction conditions in the interior of a hollow substrate tube to deposit non-vitrified silica layers on the inner surface of the hollow substrate tube, and subsequently creating a second plasma reaction zone having second reaction conditions in the interior of the hollow substrate tube to deposit vitrified silica layers on the deposited, non-vitrified silica layers. Thereafter, the hollow substrate tube is removed from the deposited, vitrified silica layers to yield a deposited tube.

20 Claims, No Drawings

(56) References Cited

U.S. PATENT DOCUMENTS

| | | | |
|---|---|---|---|
| 8,503,071 B2 | 8/2013 | Burov et al. |
| 8,520,993 B2 | 8/2013 | Molin et al. |
| 8,520,995 B2 | 8/2013 | Richard et al. |
| 8,565,568 B2 | 10/2013 | Bigot-Astruc et al. |
| 8,630,545 B2 | 1/2014 | Gholami et al. |
| 8,639,079 B2 | 1/2014 | Molin et al. |
| 8,644,664 B2 | 2/2014 | Molin et al. |
| 8,675,275 B2 | 3/2014 | Boivin et al. |
| 8,676,015 B2 | 3/2014 | Sillard et al. |
| 8,798,423 B2 | 8/2014 | Sillard et al. |
| 8,798,424 B2 | 8/2014 | Bigot-Astruc et al. |
| 8,837,889 B2 | 9/2014 | de Montmorillon et al. |
| 8,867,880 B2 | 10/2014 | Molin et al. |
| 8,879,878 B2 | 11/2014 | Bigot-Astruc et al. |
| 8,891,074 B2 | 11/2014 | Molin et al. |
| 8,983,260 B2 | 3/2015 | Sillard et al. |
| 9,014,525 B2 | 4/2015 | Molin et al. |
| 2002/0002949 A1 | 1/2002 | Breuls et al. |
| 2004/0159124 A1 | 8/2004 | Atkins et al. |
| 2007/0059534 A1* | 3/2007 | Huenermann ...... C03B 19/1423 428/428 |
| 2009/0126408 A1* | 5/2009 | Bookbinder ...... C03B 37/01853 65/415 |
| 2009/0245742 A1 | 10/2009 | Kudou et al. |
| 2009/0272716 A1* | 11/2009 | Bookbinder ...... C03B 37/01466 216/24 |
| 2010/0021170 A1 | 1/2010 | Lumineau et al. |
| 2010/0119202 A1 | 5/2010 | Overton |
| 2010/0135627 A1 | 6/2010 | Pastouret et al. |
| 2010/0287993 A1 | 11/2010 | Atkins et al. |
| 2011/0069724 A1 | 3/2011 | Richard et al. |
| 2012/0040184 A1 | 2/2012 | de Montmorillon et al. |
| 2012/0051703 A1 | 3/2012 | Bigot-Astruc et al. |
| 2012/0134376 A1 | 5/2012 | Burov et al. |
| 2012/0148206 A1 | 6/2012 | Boivin et al. |
| 2012/0224254 A1 | 9/2012 | Burov et al. |
| 2012/0243843 A1 | 9/2012 | Molin et al. |
| 2012/0275751 A1 | 11/2012 | Krabshuis et al. |
| 2012/0324958 A1* | 12/2012 | Yang ................ C03B 37/01211 65/391 |
| 2013/0029038 A1 | 1/2013 | Bickham et al. |
| 2013/0175437 A1 | 7/2013 | Burov et al. |
| 2013/0287353 A1 | 10/2013 | Molin et al. |
| 2016/0152509 A1 | 6/2016 | Milicevic et al. |
| 2016/0186316 A1 | 6/2016 | Milicevic et al. |

FOREIGN PATENT DOCUMENTS

| | | |
|---|---|---|
| EP | 0554845 A1 | 8/1993 |
| EP | 2527893 B1 | 11/2012 |
| EP | 3016915 A1 | 5/2016 |
| WO | 99/35304 A1 | 7/1999 |
| WO | 2009/062131 A1 | 5/2009 |
| WO | 2015/002530 A1 | 1/2015 |

* cited by examiner

PLASMA DEPOSITION PROCESS WITH REMOVAL OF SUBSTRATE TUBE

CROSS-REFERENCE TO PRIORITY APPLICATIONS

This application is a continuation-in-part of International Application No. PCT/NL2014/050357 for a Plasma Deposition Process with Removal of Substrate Tube, filed Jun. 5, 2014, (and published Jan. 8, 2015, as International Publication No. WO 2015/002530 A1), which itself claims the benefit of Dutch Patent Application No. 2011075 (filed Jul. 1, 2013). Each of the foregoing patent applications and patent application publication is hereby incorporated by reference in its entirety.

The present invention relates to a method for manufacturing a precursor for a primary preform for optical fibers by means of an internal plasma deposition process, such as an internal plasma chemical vapor deposition (PCVD) process. The present invention moreover relates to a method for manufacturing a primary preform for optical fibers by means of an internal plasma deposition process.

The present invention relates to the field of optical fibers. More specifically, it relates to the field of manufacturing optical fibers by means of chemical vapor deposition. There are several types of chemical vapor deposition (CVD) known, such as outside vapor deposition (OVD), vapor axial deposition (VAD), modified chemical vapor deposition (MCVD) and plasma-enhanced chemical vapor deposition (PECVD or PCVD). Plasma-enhanced chemical vapor deposition (PECVD or PCVD) is a process used to deposit thin films from a gas state (vapor) to a solid state on a substrate. Chemical reactions are involved in the process, which occur after creation of a plasma of the reacting gases.

Generally, in the field of optical fibers, multiple thin films of glass are deposited on the inside surface of a substrate tube. The substrate tube is hollow to allow internal deposition. The substrate tube may be of glass, preferably glass quartz ($SiO_2$). Glass-forming gases (viz. reactive gases comprising gases for the forming of glass and optionally precursors to dopants) are introduced into the interior of the substrate tube from one end (called the "supply side" of the substrate tube). Doped or undoped glass layers (depending on the use of reactive gases with or without one or more precursors to dopants, respectively) are deposited onto the interior surface of the substrate tube. The remaining gases are discharged or removed from the other end of the substrate tube; this is called the "discharge side" of the substrate tube. The removal is optionally carried out by means of a vacuum pump. The vacuum pump has the effect of generating a reduced pressure in the interior of the substrate tube, which reduced pressure generally comprises a pressure value ranging between 5 and 50 mbar.

Generally, the plasma is induced by the use of electromagnetic radiation (e.g., microwaves). Generally, electromagnetic radiation from a generator is directed towards an applicator via a waveguide, which applicator surrounds the substrate tube. The applicator couples the electromagnetic energy into a plasma that is generated inside the substrate tube. The applicator is moved reciprocally in the longitudinal direction of the substrate tube. Thus, the plasma formed, also called the "plasma reaction zone," is also moved reciprocally. As a result of this movement, a thin vitrified silica layer is deposited onto the interior of the substrate tube with every stroke or pass.

The applicator and the substrate tube are generally surrounded by a furnace so as to maintain the substrate tube at a temperature of between 900° C. and 1300° C. during the plasma deposition process.

Thus, the applicator is moved in translation over the length of the substrate tube within the boundaries of a furnace that surrounds the substrate tube and the applicator reciprocating within the furnace. With this translational movement of the applicator, the plasma also moves in the same direction. As the applicator reaches the inner wall of the furnace near one end of the substrate tube, the movement of the applicator is reversed so that it moves to the other end of the substrate tube towards the other inner wall of the furnace. The applicator and thus the plasma travels a back and forth movement along the length of the substrate tube. Each back and forth movement is call a "pass" or "stroke." With each pass, a thin layer of vitrified silica material is deposited on the inside of the substrate tube.

This plasma causes the reaction of the glass-forming gases (e.g., $O_2$, $SiCl_4$, and, for example, a precursor for a dopant, such as $GeCl_4$ or other gases) that are supplied to the inside of the substrate tube. The reaction of the glass-forming gases allows reaction of Si (silicon), O (oxygen), and, for example, the dopant Ge (germanium) so as to thus effect direct deposition of, for example, Ge-doped SiOx on the inner surface of the substrate tube.

Normally, a plasma is generated only in a part of the substrate tube, viz. the part that is surrounded by the applicator. The dimensions of the applicator are smaller than the dimensions of the furnace and of the substrate tube. Only at the position of the plasma, the reactive gases are converted into solid glass and deposited on the inside surface of the substrate tube. Since the plasma reaction zone moves along the length of the substrate tube, glass is deposited more or less evenly along the length of the substrate tube.

When the number of passes increases the cumulative thickness of these thin films, i.e. of the deposited material, increases; thus leading to a decrease in the remaining internal diameter of the substrate tube. In other words, the hollow space inside the substrate tube keeps getting smaller with each pass.

After the vitrified silica layers have been deposited onto the interior of the substrate tube, the substrate tube is subsequently contracted by heating into a solid rod ("collapsing"). The remaining solid rod is called a primary preform. In a special embodiment, the solid rod or primary preform may furthermore be externally provided with an additional amount of glass, for example by means of an external vapor deposition process or direct glass overcladding (so-called "overcladding") or by using one or more preformed glass tubes (so-called "sleeving"), thus obtaining a composite preform called the final preform. From the final preform thus produced, one end of which is heated, optical fibers are obtained by drawing on a drawing tower. The refractive index profile of the consolidated (final) preform corresponds to the refractive index profile of the optical fiber drawn from such a preform.

One way of manufacturing an optical preform by means of a PCVD process is known from U.S. Pat. No. 4,314,833. According to the process that is known from that document, one or more doped or undoped glass layers are deposited onto the interior of a substrate tube, using a low-pressure plasma in the substrate tube.

According to International Publication No. WO 99/35304, microwaves from a microwave generator are directed towards an applicator via a waveguide, which applicator surrounds a substrate tube. The applicator couples the high-frequency energy into the plasma.

The substrate tube is incorporated in the optical fiber produced. The glass layers deposited on the inside of the hollow substrate tube, the hollow substrate tube itself and the glass layers deposited on the outside of the hollow substrate tube or primary preform are all incorporated in the resulting final preform and are after drawing present in the optical fiber produced.

Examples of prior art documents disclosing the process of overcladding are the following. In each of these documents, the substrate tube will be incorporated into the final preform.

European Publication No. EP0554845 provides a method of overcladding wherein the deposition of glass on the inside of a hollow substrate tube is prevented.

U.S. Pat. No. 6,988,380 discloses a PCVD method for overcladding wherein the deposition of glass on the inside of the hollow substrate tube is prevented.

A disadvantage of the incorporation of the substrate tube into the optical fiber produced is that high-quality substrate tubes are required that also have a high temperature tolerance and a good adhesion to the deposited glass material. For this reason in the prior art often a quartz glass substrate tube is used.

However, it has been observed by the present inventors that the purity of said commercially available quartz tubes is not always sufficient. Moreover, the overall geometrical properties of these tubes are not always satisfactory.

Another disadvantage of the incorporation of the substrate tube into the optical fiber produced is the limitation in the refractive index profiles of the optical fibers that are produced. If, for example an optical fiber is desired having a depressed trench (i.e., a negative refractive index with respect to silica) directly surrounded by a depressed outer optical cladding, this would lead to the requirement of a substrate tube having a negative refractive index difference with respect to silica. This can be obtained, for example, by the use of a fluorine-doped silica substrate tube. However, these tubes are difficult to produce and very costly. In addition, they are softer than non-doped silica substrate tubes so that they are more difficult to use in deposition processes and more prone to breakage and deformation during the process.

If on the other hand an optical fiber profile having an outer optical cladding with a positive refractive index profile with respect to silica is desired, an up-doped silica substrate tube (e.g., germanium-doped silica) is required. Such a tube is difficult to produce, very costly, and almost impossible to process by the standard techniques at this moment.

Therefore, there is a need for an alternative solution to the problem above.

It is an object of the present invention to provide a method for manufacturing a preform for optical fibers that allows more flexibility in the refractive index of the final preform.

It is another object of the present invention to provide a process that eliminates the use of high-quality substrate tubes.

It is another object of the present invention to provide a process that enables the use of non-quartz substrate tubes.

One or more of these objects are achieved by the present invention.

SUMMARY

The present invention relates, in a first aspect, to a method for manufacturing a precursor primary preform for optical fibers by means of an internal plasma deposition process. During this process the substrate tube is removed from the layers deposited on the inside thereof.

This process according to a first aspect of the present invention comprises the steps of:
i) providing a hollow substrate tube;
ii) creating a first plasma reaction zone having first reaction conditions in the interior of said hollow substrate tube by means of electromagnetic radiation for effecting the deposition of non-vitrified silica layers on the inner surface of said hollow substrate tube, and subsequently;
iii) creating a second plasma reaction zone having second reaction conditions in the interior of said hollow substrate tube by means of electromagnetic radiation for effecting the deposition of vitrified silica layers on the non-vitrified silica layers deposited in step ii);
iv) removing the hollow substrate tube from the vitrified silica layers deposited in step iii) and the non-vitrified silica layers deposited in step ii) to obtain a deposited tube.

Said deposited tube is a precursor to a primary preform. Said deposited tube is in effect the layers of material deposited inside of said substrate tube but without the substrate tube. Said primary preform can be obtained by collapsing said deposited tube either directly or after a step of externally providing extra glass. See also the third aspect below.

In another aspect, the precursor for a primary preform obtained (viz. the deposited tube) is used as a substrate tube in a subsequent deposition process. In other words, according to this embodiment, the present invention relates to a novel process of producing a substrate tube. Thus, in this aspect, the precursor for a primary preform is a substrate tube.

In this aspect, the present invention relates to a method for manufacturing a substrate tube for optical fibers by means of an internal plasma deposition process, which method comprises the steps of: i) providing a hollow substrate tube; ii) creating a first plasma reaction zone having first reaction conditions in the interior of said hollow substrate tube by means of electromagnetic radiation for effecting the deposition of non-vitrified silica layers on the inner surface of said hollow substrate tube, and; subsequently iii) creating a second plasma reaction zone having second reaction conditions in the interior of said hollow substrate tube by means of electromagnetic radiation for effecting the deposition of vitrified silica layers on the non-vitrified silica layers deposited in step ii); and iv) removing the hollow substrate tube from the vitrified silica layers deposited in step iii) and the non-vitrified silica layers deposited in step ii) to obtain a substrate tube.

In a second aspect, the present invention relates to a method for removing a substrate tube from vitrified silica layers deposited on its inner surface by means of an internal plasma deposition process. The process of this second aspect comprises the steps i) to iv) above.

In a third aspect the present invention relates to a method for manufacturing a primary preform for optical fibers by means of an internal plasma deposition process, which method comprises the steps of:
i) providing a hollow substrate tube;
ii) creating a first plasma reaction zone having first reaction conditions in the interior of said hollow substrate tube by means of electromagnetic radiation for effecting the deposition of non-vitrified silica layers on the inner surface of said hollow substrate tube, and subsequently;

iii) creating a second plasma reaction zone having second reaction conditions in the interior of said hollow substrate tube by means of electromagnetic radiation for effecting the deposition of vitrified silica layers on the non-vitrified silica layers deposited in step ii); and iv) removing the hollow substrate tube from the vitrified silica layers deposited in step iii) and the non-vitrified silica layers deposited in step ii) to obtain a deposited tube; and v) subjecting the deposited tube obtained in step iv) to a collapsing treatment so as to form a primary preform.

Hereafter different embodiments of the present invention are disclosed. These embodiments are, unless stated otherwise, applicable to all aspects of the present invention.

In an embodiment, the hollow substrate tube has a supply side and a discharge side.

In another embodiment, a gas flow is supplied in the interior of said hollow substrate tube during step ii) of depositing non-vitrified silica layers.

In another embodiment, a gas flow is supplied in the interior of said hollow substrate tube during step iii) of depositing vitrified silica layers.

In another embodiment, a gas flow is supplied in the interior of said hollow substrate tube prior to step ii) of depositing non-vitrified silica layers.

In another embodiment, a gas flow is supplied in the interior of said hollow substrate tube after step iii) of depositing vitrified silica layers.

In another embodiment, the gas flow is supplied in the interior of said hollow substrate tube via the supply side thereof.

In another embodiment, the gas flow supplied during step ii) comprises at least one glass-forming gas.

In another embodiment, the gas flow supplied during step iii) comprises at least one glass-forming gas. During this step iii) it is possible that the composition of the gas flow changes with each pass. This is disclosed in more detailed below.

In another embodiment, the gas flow supplied prior to step ii) comprises oxygen in order to create conditions suitable for the creation of a plasma.

In another embodiment, the gas flow supplied after step iii) comprises oxygen. This gas flow supplied after step iii) is used to flush the deposited tube obtained from any residual and unwanted gases (e.g., chlorine-containing gases).

In another embodiment, said first reaction zone is moved back and forth along the longitudinal axis of said hollow substrate tube between a reversal point located near the supply side and a reversal point located near the discharge side of said hollow substrate tube. According to this embodiment, after step ii) a substrate tube having non-vitrified silica layers deposited on its inner surface is obtained.

In another embodiment, said second reaction zone is moved back and forth along the longitudinal axis of said hollow substrate tube between a reversal point located near the supply side and a reversal point located near the discharge side of said hollow substrate tube. According to this embodiment, after step iii) a substrate tube having non-vitrified silica layers deposited on its inner surface in step ii) and vitrified silica layers deposited on the non-vitrified layers in step iii) on its inner surface is obtained.

In another embodiment, the method according to the present invention comprises an additional step v) carried out after step iv). This step v) is subjecting the deposited tube obtained in step iv) to a collapsing treatment so as to form a primary preform.

In another embodiment, the method according to the present invention comprises an additional step vi). This step can be carried out after either step iv), i.e. on the deposited tube or after step v), i.e. on the primary preform. This step vi) relates to externally providing said deposited tube or said primary preform with an additional amount of glass.

In another embodiment, the following order of steps is followed:

i) providing a hollow substrate tube;

ii) creating a first plasma reaction zone having first reaction conditions in the interior of said hollow substrate tube by means of electromagnetic radiation for effecting the deposition of non-vitrified silica layers on the inner surface of said hollow substrate tube, and subsequently;

iii) creating a second plasma reaction zone having second reaction conditions in the interior of said hollow substrate tube by means of electromagnetic radiation for effecting the deposition of vitrified silica layers on the non-vitrified silica layers deposited in step ii);

iv) removing the hollow substrate tube from the vitrified silica layers deposited in step iii) and the non-vitrified silica layers deposited in step ii) to obtain a deposited tube;

v) subjecting the deposited tube obtained in step iv) to a collapsing treatment so as to form a primary preform;

vi) externally providing said primary preform obtained in step v) with an additional amount of glass to obtain a final preform.

In another embodiment, when step vi) has been carried out on the deposited tube obtained in step iv), step v) can be carried out after step vi). Hence in this embodiment, the following order of steps is as follows:

i) providing a hollow substrate tube;

ii) creating a first plasma reaction zone having first reaction conditions in the interior of said hollow substrate tube by means of electromagnetic radiation for effecting the deposition of non-vitrified silica layers on the inner surface of said hollow substrate tube, and subsequently;

iii) creating a second plasma reaction zone having second reaction conditions in the interior of said hollow substrate tube by means of electromagnetic radiation for effecting the deposition of vitrified silica layers on the non-vitrified silica layers deposited in step ii);

iv) removing the hollow substrate tube from the vitrified silica layers deposited in step iii) and the non-vitrified silica layers deposited in step ii) to obtain a deposited tube;

vi) externally providing said deposited tube obtained in step iv) with an additional amount of glass;

v) subjecting the deposited tube externally provided with glass obtained in step vi) to a collapsing treatment so as to form either a primary or a final preform.

In another embodiment, during step iv) the substrate tube is removed mechanically. Thus, in this embodiment the substrate tube is mechanically removed.

In another embodiment, the first reaction conditions comprise a pressure of higher than 30 millibars, preferably higher than 40 millibars, more preferably higher than 50 millibars, even more preferably higher than 60 millibars.

In another embodiment, the first reaction conditions comprise a pressure of lower than 1000 millibars, preferably lower than 800 millibars, more preferably lower than 600 millibars, even more preferably lower than 400 millibars, or even lower than 200 millibars.

In another embodiment, the second reaction conditions comprise a pressure of between 1 and 25 millibars, preferably between 5 and 20 millibars, more preferably between 10 and 15 millibars.

In another embodiment, the substrate tube provided in step i) a non-quartz substrate tube is used, preferably an alumina substrate tube.

In another embodiment, in step ii) between 1 and 500 non-vitrified silica layers are deposited. Depending on the type of mechanical removal used, there are different preferred ranges for the number of non-vitrified silica layers. This is explained in more detail below.

In another embodiment, step iii) includes depositing doped vitrified silica layers (and optionally undoped vitrified silica layers, too) on the non-vitrified silica layers previously deposited in step ii), such as via PCVD. The doped vitrified silica layers may include up-doped silica layers that correspond to core layers and/or cladding layers (e.g., up-doped using germanium to achieve a positive refractive index difference with respect to silica). Alternatively or additionally, the doped vitrified silica layers may include down-doped silica layers that correspond to depressed-trench layers or cladding layers (e.g., down-doped using fluorine to achieve a negative refractive index difference with respect to silica). Optional undoped vitrified silica layers can be included, too, such as to correspond to cladding layers (e.g., undoped inner cladding layers positioned between up-doped core layers and down-doped depressed-trench layers).

In another embodiment, the non-vitrified silica layers each, independently, have a thickness between 1 and 5 micrometers, preferably between 2 and 3 micrometers.

In another embodiment, the non-vitrified silica layers each have approximately the same thickness (viz. each layer has the same thickness with a margin of ±5% between the separate layers).

In another embodiment, the non-vitrified silica layers each have approximately the same volume (viz. each layer has the same volume with a margin of ±5% between the separate layers). When the inner space of the substrate tube decreases with increasing number of deposited layers, the thickness of the layers may increase when the volume stays the same (decreased diameter leads to a decreased inner surface).

In another embodiment, the non-vitrified silica layers that are deposited in total have a thickness between 1 and 1000 micrometers. Depending on the type of mechanical removal used, there are different preferred ranges for the number of non-vitrified silica layers. This is explained in more detail below. In this embodiment, the thickness is the thickness of all non-vitrified layers together.

In another aspect, the present invention relates to a method wherein the precursor for a primary preform is used as substrate tube for the manufacturing of a primary preform by means of an internal plasma deposition process. This plasma deposition process preferably comprises the steps of:
  a) providing said precursor for a primary preform; and
  b) creating a plasma reaction zone having reaction conditions in the interior of said hollow substrate tube by means of electromagnetic radiation for effecting the deposition of vitrified silica layers on inner surface of said precursor for a primary preform provided in step a).

In an embodiment, the electromagnetic radiation used is microwaves.

The present invention will be discussed in more detail below.

Definitions

The following definitions are used in the present description and claims to define the stated subject matter. Other terms not cited below are meant to have the generally accepted meaning in the field.

"hollow substrate tube" as used in the present description means: a, preferably elongated, tube having a cavity within. Generally, the inside of said tube is provided (or coated) with a plurality of glass layers during the manufacturing of a preform.

"precursor for a primary preform" as used in the present description means: an intermediate product that will lead to a primary preform after one or more additional process steps.

"primary preform" as used in the present description means: a solid rod (solid preform) that requires to be externally provided with extra glass before it becomes a final preform.

"final preform" as used in the present description means: a solid rod (solid composite preform) that can be directly used for drawing of optical fibers therefrom.

"deposited tube" as used in the present description means: a hollow tube that is constituted of vitrified silica layers deposited inside of a substrate tube that has been removed. In other words, the substrate tube is no longer present in this deposited tube.

"cavity" as used in the present description means: the space surrounded by the wall of the substrate tube.

"gas supply side" or "supply side" as used in the present description means: one side of the substrate tube, being an open end of the substrate tube that is used as inlet for the gases. The supply side is the side opposite to the discharge side.

"gas discharge side" or "discharge side" as used in the present description means: one side of the substrate tube, being an open end of the substrate tube that is used as outlet for the gases. The discharge side is the side opposite to the supply side.

"inner surface" as used in the present description means: the inside surface or interior surface of the hollow substrate tube.

"glass" or "glass material" as used in the present description means: crystalline or vitreous (glassy) oxide material—e.g., silica ($SiO_2$) or even quartz—deposited by means of a vapor deposition process.

"silica" as used in the present description means: any substance in the form of $SiO_x$, whether or not stoichiometric, and whether or not crystalline or amorphous.

"alumina" as used in the present description means: any substance in the form of $Al_yO_x$, wherein Al is aluminum and O is oxygen, whether or not stoichiometric, and whether or not crystalline or amorphous.

"glass-forming gases" as used in the present description means: reactive gases used during the deposition process to form glass layers. These glass-forming gases may comprise a precursor for a dopant. (e.g., $O_2$ and $SiCl_4$ and optionally others).

"precursor for a dopant" as used in the present description means: a compound or composition that, when introduced into glass, become a dopant having an effect of the refractive index of the glass. Precursors for dopants may for example be gases that react with one or more compounds in the glass-forming gases to form doped glass layers when vitrified. During the glass deposition, the precursor for a dopant is introduced into the glass layers.

"dopant" as used in the present description means: a compound or composition that is present in the glass of the optical fiber and that has an effect on the refractive index of said glass. It can for example be a down dopant, viz. a dopant decreasing the refractive index, such as fluorine or boron (e.g., introduced as a precursor in the form of $F_2$, $C_2F_8SF_6$, $C_4F_8$ or $BCl_3$). It can for example be an up-dopant, viz. a dopant increasing the refractive index, such as germanium (e.g., introduced as a precursor in the form of $GeCl_2$ (germanium dichloride) or $GeCl_4$ (germanium tetrachloride)). Dopants can be present in the glass either in the interstices of the glass (e.g., in the case of F) or they may be present as an oxide (e.g., in the case of germanium, aluminum, phosphorus, or boron).

"non-vitrified silica" is the same as "soot" as used in the present description and means: incompletely vitrified (=not or partly vitrified) silica. It can be either undoped or doped.

"vitrified silica" is the same as "glass" as used in the present description and means: a glassy substance produced by the complete vitrification of silica. It can be either undoped or doped.

"soot deposition" as used in the present description means: the deposition of non-vitrified silica on the inner walls of the substrate tube. Soot deposition is visible for the eye as a white opaque fine particulate material.

"reaction zone" as used in the present description means: the zone or axial location wherein the glass-forming reaction or deposition takes place. This zone is formed by a plasma and preferably moves reciprocally along the longitudinal length of the substrate tube.

"reaction conditions" as used in the present invention means: a set of conditions such as temperature, pressure, electromagnetic radiation that are used to effect the deposition of the silica layers (either non-vitrified or vitrified).

"plasma" as used in the present description means: an ionized gas consisting of positive ions and free electrons in proportions resulting in more or less no overall electric charge at very high temperatures. The plasma is induced by electromagnetic radiation, preferably by microwaves.

"reversal point" as used in the present description means: the axial point or position on the substrate tube at which the movement of the applicator reciprocates. In other words, changes from back to forth and forth to back. It is the turning point of the applicator. The axial point is measured at the middle (longitudinal) of the applicator.

"near the reversal point" as used in the present description means: an axial position on the substrate tube that is close in distance to the reversal point or is the same position as the reversal point.

"at the reversal point" as used in the present description means: an axial position on the substrate tube that is the same position as the reversal point.

"moved back and forth" as used in the present description means: a reciprocating movement or moving backwards and forwards in a straight line.

"phase" as used in the present description means: a part of the deposition process in which glass layers having a specific refractive index value are deposited. The specific value may be constant or exhibit a gradient. For example, for a simple step index fiber the deposition of the core and the deposition of the cladding are each considered a separate phase.

"stroke" or "pass" as used in the present description means: each back and forth movement of the applicator along the length of the substrate tube.

DETAILED DESCRIPTION

The present invention relates, in a first aspect, to a method for manufacturing a precursor for a primary preform for optical fibers by means of an internal plasma deposition process. During this process, the substrate tube is removed. In a second aspect, the present invention relates to a method for removing a substrate tube from glass layers deposited on its inner surface by means of an internal plasma deposition process. In a third aspect, the present invention relates to a method for manufacturing a primary preform for optical fibers by means of an internal plasma deposition process.

The solution that the present inventors have found to the problems cited above for the prior art is the removal of the substrate tube, enabling the use of a non-quartz substrate tube. This solution entails the removal of the substrate tube after silica layer deposition inside of said substrate tube. This removal is facilitated by the presence of a layer of soot (non-vitrified glass) between the inner surface of said substrate tube and the deposited glass layers. This silica soot has a certain (albeit limited) adherence to the glass layers to be deposited and has a certain (albeit limited) adherence to the substrate tube, which, for example, can be of alumina. It thus acts as a barrier between two vitrified parts, firstly the substrate, which is preferably a glass or silica-based substrate tube, and on the other hand the glass layers that are deposited. This barrier layer will act as a non-stick layer or buffer layer, which allows the separation of the two vitrified silica layers on either side. In principle, it can be seen as a buffer layer between two tubes, on the outside the substrate tube and on the inside the deposited tube.

The adherence of the soot layer (non-vitrified silica layer) to the substrate tube should on the one hand be sufficient to allow a layer to be formed (preferably a continuous layer, and/or preferably a layer having substantially constant coverage of the inner surface of the substrate tube, and/or preferably a layer having a substantial constant thickness over the length of the substrate tube). The adherence of the soot layer to the substrate tube should on the other hand be not too high to allow separation of the substrate tube from the soot layer.

The adherence of the soot layer to the glass layers to be deposited should on the one hand be sufficient to allow the glass layers to be formed. The adherence of the soot layer to the glass layers to be deposited should on the other hand be not too high to allow separation of the glass layers from the soot layer.

It is possible for the present invention that the non-vitrified silica layers are removed by the use of a liquid, such as water or another aqueous solution. The brittle particulate of non-vitrified silica is broken so that a fine, dust-like material dispersed in the liquid is obtained, which can be removed by removing the liquid.

The substrate tube used according to the present invention is preferably a non-quartz substrate tube. It is possible to use a quartz substrate tube, such as of lower purity. The substrate tube should be able to withstand high temperatures that are used in the deposition process. Moreover, the substrate tube should be transparent to electromagnetic radiation to allow a plasma to be formed inside of said substrate tube. The inner and outer dimension of the substrate tube used in the present invention can be selected according to the requirements of the process equipment and the amount and type of optical fiber to be formed. It may be required that the substrate tubes are subjected to a pre-treated process in order to make them suitable for use in the plasma deposition equipment that is used in the present invention.

The present method comprises the following steps, which are not all essential in all of the embodiments. It is possible that some of these steps are carried out in a different order.

The first step is providing a hollow glass tube. Said hollow substrate tube may preferably have a supply side and a discharge side. This hollow substrate tube is used for the internal deposition of layers on the inner surface thereof. A gas line (or optionally a main gas line and at least one secondary gas lines) is attached to said supply side and preferably a vacuum pump is attached to said discharge side.

In another step, a gas flow is supplied into the interior of said hollow substrate tube. This gas flow is preferably introduced via the supply side of said substrate tube. Said gas flow comprises at least one glass-forming gas. For example, oxygen and silicon tetrachloride. Optionally, said gas flow also comprises, during at least a part of the deposition process, at least one precursor for a dopant, such as germanium (e.g., in the form of germanium tetra- or dichloride) and/or fluorine (e.g., in the form of C2F6). Firstly only oxygen is introduced, later optionally an etching gas, even later the glass-forming gases.

In a following step, a plasma reaction zone is created in the interior of said hollow substrate tube. The plasma reaction zone does not span the full length of the substrate tube but only a part surrounded by the applicator. In other words, the plasma reaction zone is created in a part of the interior of the hollow substrate tube. The plasma is created by means of electromagnetic radiation. This plasma reaction zone provides the conditions that are suitable for effecting the deposition of vitrified glass layers or non-vitrified glass layers—depending on the conditions—on the inner surface of said hollow substrate tube by allowing the reaction of the glass-forming gases and optionally one or more precursors for dopants. In other words, the plasma reaction zone is the three dimensional space that is taken up by the plasma inside of the substrate tube.

The reaction zone is preferably reciprocated between two reversal points, each of which is located at or near the ends of the substrate tube. There is one reversal point near the supply side and there is one reversal point near the discharge side. The applicator of electromagnetic radiation is present coaxially over the substrate tube. The plasma formed moves back and forth along the longitudinal axis of said hollow substrate tube together with the applicator. The movement reciprocates between a reversal point located near the supply side and a reversal point located near the discharge side of said hollow substrate tube. This reciprocation takes place a number of times (called passes or strokes), and during each pass or stroke a thin layer of vitrified or non-vitrified glass is deposited. In case the deposition process is carried out in several phases, each phase typically comprises a plurality of strokes, for example between 1000 and 10,000 strokes, such as 2000 to 4000 strokes. In this way, glass layers having a specific refractive index value are deposited, such as to achieve a desired refractive index profile (e.g., a step refractive index profile or a gradient refractive index profile).

During step ii) of the present inventive method, a first plasma reaction zone is provided for the deposition of non-vitrified glass. First reaction conditions are applied. These first reaction conditions are effective for the production of non-vitrified silica layers, in other words these conditions are chosen to prevent deposition of vitrified silica. A gas flow of glass-forming gases is present during this step. In an embodiment, a high pressure (e.g., >50 mbar) is used to prevent vitrification. This is a consequence of the fact that the pressure determines the amount of silica formation in the gas phase. When the pressure in the substrate tube is low enough only a small amount of soot (SiO2 or GeO2) will be formed in the gas phase and the majority of glass-forming gas will react as vitrified silica on the inner diameter of the substrate tube. If the pressure is higher than 50 mbar, there will be a significant amount of soot creation through the clustering of silica particles in the gas phase before deposition on the inner diameter of the substrate tube. The soot will stick to the substrate tube and one will be able to remove it afterwards. If one conducts the plasma deposition process in a higher-pressure regime (>30 mbar or even >60 mbar), one finds that the deposition is consisting for a great part of soot material.

It should be noted that preferably the non-vitrified silica is supplied on a large part of the inner surface of the substrate tube, such as between the reversal point near the supply side and the reversal point near the discharge side. Preferably, the area of the inner surface that is to be covered by the vitrified silica layers is also covered previously by non-vitrified silica layers. This will facilitate the later removal of the substrate tube without damaging the vitrified silica layers, viz. the deposited layers.

During step iii) of the present inventive method, a second plasma reaction zone is provided for the deposition of vitrified silica. Thus, this step entails creating a second plasma reaction zone having second reaction conditions in the interior of said hollow substrate tube having deposited, non-vitrified glass layers on its inner surface by means of electromagnetic radiation for effecting the deposition of vitrified silica layers on the non-vitrified silica layers deposited in a previous step. The second reaction conditions as used during this step in order to obtain a plasma reaction zone suitable for the deposition of glass is known in the field.

In exemplary embodiments, step iii) includes depositing doped (and optionally undoped) vitrified silica layers on the non-vitrified silica layers previously deposited in step ii). In this way, the process can facilitate the achievement of optical fibers having various refractive index profiles (e.g., step and gradient refractive index profiles).

In one exemplary embodiment, the present method can be implemented to yield bend-insensitive optical fibers, such as by depositing depressed-trench layers within the substrate tube (e.g., a low-quality silica tube) as an intermediate step to forming an overcladded optical preform. By way of illustration, the doped vitrified silica layers may include up-doped silica layers that correspond to core layers and/or cladding layers (e.g., up-doped using germanium to achieve a positive refractive index difference with respect to silica). By way of further example, the doped vitrified silica layers may include down-doped silica layers that correspond to depressed-trench layers or cladding layers (e.g., down-doped using fluorine to achieve a negative refractive index difference with respect to silica). As noted, the vitrified silica layers may optionally include undoped vitrified silica layers, such as corresponding to cladding layers (e.g., undoped inner cladding layers positioned between up-doped core layers and down-doped depressed-trench layers).

Accordingly, the present method for manufacturing a primary preform can be implemented to achieve bend-insensitive optical fibers (e.g., trench-assisted, bend-insensitive optical fibers). Exemplary bend-insensitive optical fibers are disclosed in commonly assigned U.S. Pat. No. 7,555,186, U.S. Pat. No. 7,587,111, U.S. Pat. No. 7,623,747, U.S. Pat. No. 7,899,293, U.S. Pat. No. 7,889,960, U.S. Pat. No. 7,894,698, U.S. Pat. No. 7,995,889, U.S. Pat. No. 8,103,143, U.S. Pat. No. 8,131,125, U.S. Pat. No. 8,145,025, U.S. Pat. No. 8,428,414, and U.S. Pat. No. 8,837,889. Each of these commonly assigned U.S. patents is hereby incorporated by reference in its entirety.

At the end of this deposition step of the process of the present invention, a substrate tube having the desired number of vitrified silica layers deposited on its inner surface is obtained. At that moment, the deposition process is stopped. Thus, the electromagnetic radiation is stopped as well as the gas flow comprising glass-forming gases.

In a following step of the present invention, the substrate tube is removed. This will yield a so-called deposited tube or the layers of vitrified silica that have been deposited.

In an optional step of the present invention, the deposited tube is subjected to a collapsing treatment so as to form a solid rod. However, it can be envisaged that the finished deposited tube is transported to another facility where this collapsing step is carried out. During this collapsing step, the hollow tube is heated by using an external heat source such as a furnace or burners to a temperature of between 1800° C. and 2200° C. In several strokes or collapsing passes, the hollow tube is heated and collapses onto itself to form a solid rod.

In an optional step of the present invention, the deposited tube or primary preform obtained may furthermore be externally provided with an additional amount of glass, such as by means of an external vapor deposition process or direct glass deposition process (so-called "overcladding") or by using one or more preformed glass tubes that are provided over the outside surface of the primary preform obtained according to the method of the present invention. This process is called "sleeving." When a solid rod is used as the starting point, a composite preform called the final preform is obtained. In the method according to the present invention, this step of externally providing extra glass can be carried out by using doped glass. In a preferred embodiment, the overcladding process uses natural or synthetic silica. This can be doped or undoped silica. In an embodiment, fluorine-doped silica is used in the overcladding process (e.g., to obtain an optical fiber having a buried outer optical cladding).

From the final preform thus produced, one end of which is heated, optical fibers are obtained by drawing on a drawing tower. The refractive index profile of the consolidated (collapsed) preform corresponds to the refractive index profile of the optical fiber drawn from such a preform.

The removal of the substrate tube is preferably mechanical removal. Mechanical removal can be carried out by hand or in a machine.

The substrate tube can be removed in several ways. In a first aspect, the substrate tube will remain intact after removal. In a second aspect, the substrate tube will not remain intact after removal.

For example, near both longitudinal ends of the substrate tube a circular (radial) cut is made, preferably through the thickness of the substrate tube, optionally extending into the soot layer. After this radial cut, the substrate tube is in principle coaxially present in a non-connected (loose) manner around the deposited glass layers. The soot layer is brittle and by rotating or sliding of the loose substrate tube, this soot layer can be broken or shattered to provide movement between the substrate tube and the glass layers. It should however be noted that this movement is very limited in nature since the spacing between the substrate tube and the glass layer is filled with the (broken or shattered) soot layer.

According to the first aspect, an embodiment is as follows. Firstly, radial cuts are made near both longitudinal ends as discussed above. Following, one (or both) ends of the substrate tube are removed (e.g., by making a deeper radial cut that goes through the complete substrate tube and deposited tube) so that the substrate tube can be slid off the deposited glass layer inside of it. This allows the substrate tube to be reused for another deposition process. It is preferred that according to this embodiment the total thickness of the non-vitrified layers (soot layers) is between 200 and 1000 micrometers. It is preferred that the number of non-vitrified layers is between 100 and 500. This allows sufficient distance between the two coaxial tubes (viz. the outer substrate tube and the inner-deposited tube) for removal to be effected.

It is possible for the present invention that the non-vitrified silica layers are removed by the use of a liquid, such as water or another aqueous solution. When such a liquid is introduced in the space between the two coaxial tubes and the tubes are moved with respect to each other, the brittle particulate of non-vitrified silica is broken so that a fine, dust-like material dispersed in the liquid is obtained, which can be removed by removing the liquid. After removal of the liquid and the particulate, a hollow space is obtained between the two coaxial tubes facilitating the removal of the outer, substrate tube.

For the second aspect, wherein the substrate tube is not remained intact, several, non-limiting, embodiments are provided below.

In another embodiment, the substrate tube can be subjected to one or more (preferably two opposite) longitudinal cuts (e.g., by a machine operated saw blade). These longitudinal cuts (or cut) are preferably over the full length of the substrate tube. These cuts (or cut) are preferably through the thickness of the substrate tube, optionally extending into the soot layer. After these cuts (or cut) are made, two halves (or more portions) of the substrate tube can be removed. This does not allow for the reuse of the substrate tube.

In another embodiment, the substrate tube can be subjected to a hand operated hammer and chisel to form a crack (or more cracks). These cracks might progress in a longitudinal direction. This will shatter the substrate tube, which is removed in a plurality of parts. This does not allow for the reuse of the substrate tube.

In another embodiment, the substrate tube is provided with one more longitudinal or helical grooves made with a glass workers diamond knife, followed by shattering of the substrate tube. This could be done either machine or hand operated. This does not allow for the reuse of the substrate tube.

For these embodiments of the second aspect, it is not necessary to have a certain thickness of the non-vitrified silica to allow for sufficient spacing between the two tubes. In order to reduce the manufacture time and cost, in this case a total thickness of the non-vitrified layers is preferably between 1 and 100 micrometers, more preferably maximally 40 micrometers, even more preferably maximally 20 micrometers. The number of non-vitrified silica layers is preferably between 1 and 50, more preferably maximally 20, even more preferably maximally 10.

In a further aspect for these embodiments of the second aspect, the ends of the substrate tube (weld ends) can be maintained in place. This allows easy transfer of the deposited tube (after removal of the substrate tube) to a next step in the process (e.g., a collapsing apparatus or a plasma deposition apparatus). In this case, the step of radial cutting near both longitudinal ends can be carried out as a first step in the removal of the substrate tube.

In another aspect, the present invention relates to a method wherein the precursor for a primary preform is used as substrate tube for the manufacturing of a primary preform by means of an internal plasma deposition process. This plasma deposition process preferably comprises the steps of:

a) providing said precursor for a primary preform; and
b) creating a plasma reaction zone having reaction conditions in the interior of said hollow substrate tube by means of electromagnetic radiation for effecting the deposition of vitrified silica layers on inner surface of said precursor for a primary preform provided in step a).

The precursor for a primary preform used in step a) is the precursor as obtained in a first aspect of the present invention.

It should be noted that the plasma reaction zone and reaction conditions of step b) are similar or the same as the second plasma reaction zone and second reaction conditions described above. It is possible that after step b) a collapsing step is carried out as described above for other aspects. All embodiments and information disclosed above with respect to the plasma deposition process is also applicable for this embodiment.

The present invention does not required significant changes to the instrumental setup or apparatus that are already in use. Therefore, the solution to the problem presented in the present invention is easy and cost-effective to implement.

The present invention will now be explained based on an example. The present invention, however, is by no means limited to the following example.

EXAMPLE

A low-quality silica tube provided on both ends with a welded glass rod ("handle") is placed in a PCVD lath surrounded by a furnace. The furnace is brought to a temperature of 1100° C. while oxygen is flown through the substrate tube at a pressure of 15 millibars. The speed of the resonator is 20 meters per minute. A plasma is induced and the pressure is increased to 60 millibars. Approximately 20 layers of non-vitrified undoped silica are deposited in a period of 2 minutes. The pressure is subsequently decreased to approximately 14 millibars and approximately 160 layers of vitrified silica are deposited in approximately 12 minutes.

When the complete process is finished, the tube is taken out of the PCVD lathe to cool down in surrounding air (no forced cooling is applied). When the tube is at room temperature (23° C.), a saw cut is made near the gas supply side (at 50 millimeters from the end of the tube) and near the discharge side (at 100 millimeters from the end of the tube). Then the substrate tube is removed from the deposited tube by using a chisel and a hammer. The two welded ends remain in position. The deposited tube is provided in a collapsing apparatus and collapsed to provide a solid core rod.

Therefore, one or more aims of the present invention mentioned above have been reached. More embodiments of the present invention are cited in the appended claims.

To supplement the present disclosure, this application incorporates entirely by reference the following commonly assigned patents and patent application publications: U.S. Pat. No. 4,838,643 for a Single Mode Bend Insensitive Fiber for Use in Fiber Optic Guidance Applications (Hodges et al.); U.S. Pat. No. 7,623,747 for a Single Mode Optical Fiber (de Montmorillon et al.); U.S. Pat. No. 7,587,111 for a Single-Mode Optical Fiber (de Montmorillon et al.); U.S. Pat. No. 7,356,234 for a Chromatic Dispersion Compensating Fiber (de Montmorillon et al.); U.S. Pat. No. 7,483,613 for a Chromatic Dispersion Compensating Fiber (Bigot-Astruc et al.); U.S. Pat. No. 7,526,177 for a Fluorine-Doped Optical Fiber (Matthijsse et al.); U.S. Pat. No. 7,555,186 for an Optical Fiber (Flammer et al.); U.S. Pat. No. 8,055,111 for a Dispersion-Shifted Optical Fiber (Sillard et al.); U.S. Pat. No. 8,041,172 for a Transmission Optical Fiber Having Large Effective Area (Sillard et al.); International Patent Application Publication No. WO 2009/062131 A1 for a Microbend-Resistant Optical Fiber (Overton); U.S. Pat. No. 8,265,442 for a Microbend-Resistant Optical Fiber (Overton); U.S. Pat. No. 8,145,025 for a Single-Mode Optical Fiber Having Reduced Bending Losses (de Montmorillon et al.); U.S. Pat. No. 7,889,960 for a Bend-Insensitive Single-Mode Optical Fiber (de Montmorillon et al.); U.S. Patent Application Publication No. US2010/0021170 A1 for a Wavelength Multiplexed Optical System with Multimode Optical Fibers (Lumineau et al.); U.S. Pat. No. 7,995,888 for a Multimode Optical Fibers (Gholami et al.); U.S. Patent Application Publication No. US2010/0119202 A1 for a Reduced-Diameter Optical Fiber (Overton); U.S. Pat. No. 8,630,545 for a Multimode Optical System (Gholami et al.); U.S. Pat. No. 8,259,389 for an Amplifying Optical Fiber and Method of Manufacturing (Pastouret et al.); U.S. Patent Application Publication No. US2010/0135627 A1 for an Amplifying Optical Fiber and Production Method (Pastouret et al.); U.S. Pat. No. 8,467,123 for an Ionizing Radiation-Resistant Optical Fiber Amplifier (Regnier et al.); U.S. Pat. No. 8,274,647 for a Method of Classifying a Graded-Index Multimode Optical Fiber (Gholami et al.); U.S. Pat. No. 8,520,995 for a Single-Mode Optical Fiber (Richard et al.); U.S. Pat. No. 8,290,324 for a Single-Mode Optical Fiber Having an Enlarged Effective Area (Sillard et al.); U.S. Pat. No. 8,301,000 for a Single-Mode Optical Fiber (Sillard et al.); U.S. Pat. No. 8,503,071 for an Optical Fiber Amplifier Having Nanostructures (Burov et al.); U.S. Pat. No. 8,009,950 for a Multimode Fiber (Molin et al.); U.S. Pat. No. 8,867,880 for a Large Bandwidth Multimode Optical Fiber Having a Reduced Cladding Effect (Molin et al.); U.S. Pat. No. 8,520,993 for a Multimode Optical Fiber Having Improved Bending Losses (Molin et al.); U.S. Pat. No. 8,340,488 for a Multimode Optical Fiber (Molin et al.); U.S. Patent Application Publication No. US2011/0069724 A1 for an Optical Fiber for Sum-Frequency Generation (Richard et al.); U.S. Pat. No. 8,675,275 for a Rare-Earth-Doped Optical Fiber Having Small Numerical Aperture (Boivin et al.); U.S. Pat. No. 8,280,213 for a High-Bandwidth, Multimode Optical Fiber with Reduced Cladding Effect (Molin et al.); U.S. Pat. No. 8,483,535 for a High-Bandwidth, Dual-Trench-Assisted Multimode Optical Fiber (Molin et al.); U.S. Pat. No. 8,406,593 for a Multimode Optical Fiber with Low Bending Losses and Reduced Cladding Effect (Molin et al.); U.S. Pat. No. 8,428,410 for a High-Bandwidth Multimode Optical Fiber Having Reduced Bending Losses (Molin et al.); U.S. Pat. No. 8,983,260 for a Non-Zero Dispersion Shifted Optical Fiber Having a Large Effective Area (Sillard et al.); U.S. Pat. No. 8,676,015 for a Non-Zero Dispersion Shifted Optical Fiber Having a Short Cutoff Wavelength (Sillard et al.); U.S. Pat. No. 8,565,568 for a Broad-Bandwidth Multimode Optical Fiber Having Reduced Bending Losses (Bigot-Astruc et al.); U.S. Pat. No. 8,428,411 for a Single-Mode Optical Fiber (de Montmorillon et al.); U.S. Patent Application Publication No. 2012/0051703 A1 for a Single-Mode Optical Fiber (Bigot-Astruc et al.); U.S. Patent Application Publication No. 2012/0040184 A1 for a Method of Fabricating an Optical Fiber Preform (de Montmorillon et al.); U.S. Pat. No. 8,891,074 for a Multimode Optical Fiber Insensitive to Bending Losses (Molin et al.); U.S. Patent Application Publication No. 2012/0134376 A1 for a Radiation-Insensitive Optical Fiber Doped with Rare Earths (Burov et al.); U.S. Patent Application Publication No. 2012/0148206 A1 for a Rare-Earth-Doped Optical Fiber (Boivin et al.); U.S. Pat. No. 8,644,664 for a Broad-Bandwidth Optical Fiber (Molin et al.); U.S. Pat. No. 8,391,661 for a Multimode Optical Fiber (Molin et al.); U.S. Patent Application Publication No. 2012/0224254 A1 for a Rare-Earth-Doped Amplifying Optical Fiber (Burov et al.); U.S. Patent Application Publication No. 2012/0243843 A1 for a Bend-Resistant Multimode Optical Fiber (Molin et al.); U.S. Pat. No. 8,639,079 for a Multimode Optical Fiber (Molin et al.); U.S. Patent Application Publication No. 2012/0275751 A1 for a High-Bandwidth, Radiation-Resistant Multimode Optical Fiber (Krabshuis et al.); U.S. Pat. No. 8,798,423 for a Single-Mode Optical Fiber (Sillard et al.); U.S. Pat. No. 8,798,424 for a Single-Mode Optical Fiber (Sillard et al.) U.S. Pat. No. 8,879,878 for a Multimode Optical Fiber (Bigot-Astruc et al.); U.S. Pat. No. 9,014,525 for a Trench-Assisted Multimode Optical Fiber (Molin); U.S. Patent Application Publication No. 2013/0175437 A1 for an Hydrogen-Sensing Optical Fiber (Burov et al.) and U.S. Patent Application Publication No. 2013/0287353 A1 for an Hybrid Single-Mode and Multimode Optical Fiber (Molin et al.).

Typical embodiments of the invention have been disclosed in the specification. The present invention is not limited to such exemplary embodiments. The use of the term "and/or" includes any and all combinations of one or more of the associated listed items. Unless otherwise noted, specific terms have been used in a generic and descriptive sense and not for purposes of limitation.

The invention claimed is:

1. A method for manufacturing a precursor for a primary preform for optical fibers via an internal plasma deposition process, the method comprising the following steps:
   i) providing a hollow substrate tube;
   ii) creating a first plasma reaction zone having first reaction conditions in the interior of the hollow substrate tube by means of electromagnetic radiation to deposit non-vitrified silica layers on the inner surface of the hollow substrate tube;
   iii) creating a second plasma reaction zone having second reaction conditions in the interior of the hollow substrate tube by means of electromagnetic radiation to deposit vitrified silica layers on the non-vitrified silica layers deposited in step ii); and
   iv) removing the hollow substrate tube from the vitrified silica layers deposited in step iii) to obtain a deposited tube.

2. The method according to claim 1, wherein step iii) comprises depositing doped vitrified silica layers on the non-vitrified silica layers deposited in step ii).

3. The method according to claim 2, wherein the doped vitrified silica layers correspond to depressed-trench layers.

4. The method according to claim 2, wherein the doped vitrified silica layers correspond to cladding layers.

5. The method according to claim 2, wherein the doped vitrified silica layers correspond to core layers.

6. The method according to claim 1, wherein step iii) comprises depositing doped and undoped vitrified silica layers on the non-vitrified silica layers deposited in step ii).

7. The method according to claim 1, wherein step iv) comprises removing the non-vitrified silica layers deposited in step ii) from the vitrified silica layers deposited in step iii).

8. A method for manufacturing a precursor for a primary preform for trench-assisted, bend-insensitive optical fibers via an internal plasma deposition process, the method comprising the following steps:
   i) providing a hollow substrate tube;
   ii) creating a first plasma reaction zone having first reaction conditions in the interior of the hollow substrate tube by means of electromagnetic radiation to deposit non-vitrified silica layers on the inner surface of the hollow substrate tube;
   iii) creating a second plasma reaction zone having second reaction conditions in the interior of the hollow substrate tube by means of electromagnetic radiation to deposit doped vitrified silica layers on the non-vitrified silica layers deposited in step ii), wherein the doped vitrified silica layers comprise depressed-trench layers; and
   iv) removing the hollow substrate tube from the vitrified silica layers deposited in step iii) to obtain a deposited tube.

9. The method according to claim 8, comprising an additional step v) of collapsing the deposited tube obtained in step iv) form a primary preform.

10. The method according to claim 9, comprising an additional step vi) of externally providing the primary preform of step v) with an additional amount of glass.

11. The method according to claim 8, comprising an additional step vi) of externally providing the deposited tube of step iv) with an additional amount of glass.

12. The method according to claim 8, comprising the subsequent step of creating a plasma reaction zone having reaction conditions in the interior of the deposited tube by means of electromagnetic radiation to deposit vitrified silica layers on the inner surface of the deposited tube.

13. The method according to claim 8, wherein the pressure of the first reaction conditions is between 30 millibar and 1000 millibar.

14. The method according to claim 8, wherein the pressure of the second reaction conditions is between 1 and 25 millibar.

15. The method according to claim 8, wherein hollow substrate tube provided in step i) is a non-quartz substrate tube.

16. The method according to claim 8, wherein the total thickness of the non-vitrified silica layers deposited in step ii) is between 1 and 1000 micrometers.

17. The method according to claim 1, comprising the subsequent step of creating a plasma reaction zone having reaction conditions in the interior of the deposited tube by means of electromagnetic radiation to deposit vitrified silica layers on the inner surface of the deposited tube.

18. The method according to claim 1, wherein the pressure of the first reaction conditions is between 30 millibar and 1000 millibar.

19. The method according to claim 1, wherein the pressure of the second reaction conditions is between 1 and 25 millibar.

20. The method according to claim 1, wherein hollow substrate tube provided in step i) is a non-quartz substrate tube.

* * * * *